(12) United States Patent
Mazzillo et al.

(10) Patent No.: US 10,371,572 B2
(45) Date of Patent: Aug. 6, 2019

(54) INTEGRATED ELECTRONIC DEVICE FOR DETECTING ULTRAVIOLET RADIATION

(71) Applicant: STMicroelectronics S.r.l., Agrate Brianza (IT)

(72) Inventors: Massimo Cataldo Mazzillo, Corato (IT); Antonella Sciuto, S. Giovanni la Punta (IT); Paolo Badalà, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/900,049

(22) Filed: Feb. 20, 2018

(65) Prior Publication Data
US 2018/0188106 A1   Jul. 5, 2018

Related U.S. Application Data

(63) Continuation of application No. 14/960,131, filed on Dec. 4, 2015, now Pat. No. 9,933,301.

(30) Foreign Application Priority Data

May 29, 2015   (IT) .................. 102015000019370

(51) Int. Cl.
| | |
|---|---|
| *G01J 1/42* | (2006.01) |
| *H01L 27/146* | (2006.01) |
| *H01L 31/101* | (2006.01) |
| *H01L 31/108* | (2006.01) |

(52) U.S. Cl.
CPC ........ *G01J 1/429* (2013.01); *H01L 27/14621* (2013.01); *H01L 27/14683* (2013.01); *H01L 31/108* (2013.01); *H01L 31/1013* (2013.01)

(58) Field of Classification Search
CPC ............... G01J 1/429; H01L 27/14621; H01L 27/14683
See application file for complete search history.

(56) References Cited

U.S. PATENT DOCUMENTS

| | | | |
|---|---|---|---|
| 2006/0038249 A1 | 2/2006 | Koyama | |
| 2007/0241279 A1 | 10/2007 | Starikov et al. | |
| 2008/0237763 A1* | 10/2008 | Miura | ................... H01L 27/144 257/432 |

(Continued)

OTHER PUBLICATIONS

Ngu et al., "Array of Two UV-Wavelength Detector Types," IEEE Transactions on Electron Devices, 57(6), Jun. 2010, pp. 1224-1229.

(Continued)

*Primary Examiner* — Hugh Maupin
(74) *Attorney, Agent, or Firm* — Seed IP Law Group LLP (57) ABSTRACT

An integrated electronic device for detecting the composition of ultraviolet radiation includes a cathode region formed by a semiconductor material with a first type of conductivity. A first anode region and a second anode region are laterally staggered with respect to one another and are set in contact with the cathode region. The cathode region and the first anode region form a first sensor. The cathode region and the second anode region form a second sensor. In a spectral range formed by the UVA band and by the UVB band, the first and second sensors have, respectively, a first spectral responsivity and a second spectral responsivity different from one another.

20 Claims, 5 Drawing Sheets

(56) References Cited

U.S. PATENT DOCUMENTS

| | | | |
|---|---|---|---|
| 2010/0301445 A1* | 12/2010 | Mazzillo | H01L 31/03529 257/450 |
| 2012/0018827 A1* | 1/2012 | Kestelli | G01D 5/54 257/427 |
| 2012/0199826 A1 | 8/2012 | Nakahara et al. | |
| 2012/0241633 A1 | 9/2012 | Smith et al. | |

OTHER PUBLICATIONS

Averin et al., "A Bicolor Photodetector of Ultraviolet Radiation Based on a Low-Dimensional ZnCdS/ZnMgS/GaP Heterostructure," Journal of Communications Technology and Electronics, 60(4), pp. 406-409, Pleiades Publishing, Inc., 2015.

* cited by examiner

INTEGRATED ELECTRONIC DEVICE FOR DETECTING ULTRAVIOLET RADIATION

BACKGROUND

Technical Field

The present disclosure relates to an integrated electronic device for detecting ultraviolet radiation, and in particular for detecting the composition of ultraviolet radiation.

Description of the Related Art

As is known, numerous devices are available today that enable measurement of the amount of ultraviolet light to which a person is subjected during everyday life. Such devices commonly equip personal systems such as, for example, cellphones and wearable devices so that the latter are able to provide the user with indications regarding, precisely, the amount of ultraviolet light that reaches them. In particular, the devices for measuring the amount of ultraviolet light, referred to hereinafter as "ultraviolet detectors", provide the user with indications regarding the degree of danger of the ultraviolet radiation to which they are subjected.

In detail, the spectral region of ultraviolet radiation is comprised between 100 nm and 400 nm. In addition, ultraviolet radiation is divided into:

UVA radiation, with wavelengths comprised in the 315-to-400-nm range;

UVB radiation, with wavelengths comprised in the 280-to-315-nm range; and

UVC radiation, with wavelengths comprised in the 100-to-280-nm range.

In nature, ultraviolet radiation is emitted by the Sun. In addition, UVC radiation is substantially absorbed by ozone in the atmosphere, before reaching the Earth; consequently, it is generally neglected when the effects of ultraviolet radiation on human beings are considered. UVA radiation and UVB radiation, instead, manage to pass through the atmosphere. In its passage through the atmosphere, UVB radiation is in any case attenuated more than UVA radiation, which, further, penetrates into the skin more effectively as compared to UVB radiation.

This having been said, typically ultraviolet detectors supply an index known as "UV index" (UVI), which is defined as:

$$UVI = K_{er} \cdot \int_{280nm}^{400nm} S_{er}(\lambda) \cdot F(\lambda) \cdot d(\lambda)$$

where $K_{er}$ is a constant equal to 40 m²/W, $S_{er}(\lambda)$ is the so-called "erythema reference action spectrum", which is established by the International Lighting Commission (Commission Internationale de l'Éclairage—CIE), and $F(\lambda)$ is the solar spectral irradiance, expressed in W/(m²·nm). As the UV index increases, the degree of danger of radiation increases.

The UV index provides a rough estimate of the danger of ultraviolet radiation. However, it does not enable precise knowledge of the spectral composition of ultraviolet radiation.

BRIEF SUMMARY

The aim of the present disclosure is thus to provide an integrated electronic device that will overcome at least in part the drawbacks of the known art.

BRIEF DESCRIPTION OF THE SEVERAL VIEWS OF THE DRAWINGS

For a better understanding of the present disclosure, preferred embodiments thereof are now described purely by way of non-limiting example and with reference to the attached drawings, wherein.

DETAILED DESCRIPTION

Figure 1:
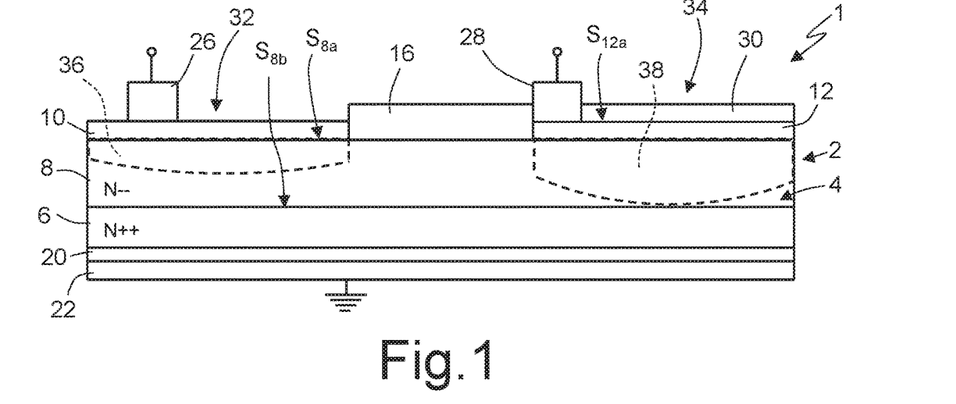
FIGS. 1, 4, and 5 are schematic cross-sectional views (not in scale) of embodiments of the present integrated electronic device.

FIG. 1 shows an integrated electronic device 1 for detecting ultraviolet radiation, which is formed in a first die 2 of semiconductor material.

In detail, the integrated electronic device 1 comprises a semiconductor body 4, made, for example, of silicon carbide, and in particular of so-called 4H polytype of silicon carbide (4H—SiC).

In greater detail, the semiconductor body 4 comprises a substrate 6 of an N++ type (for example, doped with nitrogen), which has a doping level equal, for example, to $1 \times 10^{19}$ cm⁻³ and a thickness, for example, of 300 µm. Furthermore, the semiconductor body 4 comprises an epitaxial layer 8 of an N-- type, which extends over the substrate 6 and in direct contact with the latter. The epitaxial layer 8 has a doping level comprised, for example, between $8 \times 10^{13}$ cm⁻³ and $2 \times 10^{14}$ cm⁻³, and a thickness comprised, for example, between 15 µm and 30 µm. The epitaxial layer 8 is delimited at the top and at the bottom by a first surface $S_{8a}$ and a second surface $S_{8b}$, respectively. The second surface $S_{8b}$ contacts the substrate 6.

The integrated electronic device 1 further comprises a first anode region 10 and a second anode region 12, each of which is made of nickel silicide ($Ni_2Si$) and extends over the first surface $S_{8a}$, in contact with the epitaxial layer 8. In particular, the first and second anode regions 10, 12 are laterally staggered with respect to one another to be physically separate. Further, without any loss of generality, the first and second anode regions 10, 12 have a same thickness, comprised, for example, between 10 nm and 30 nm. Further extending on the first surface $S_{8a}$ is a dielectric region 16, referred to hereinafter as "separation region 16".

The separation region 16 is arranged between the first and second anode regions 10, 12 and contacts the epitaxial layer 8, in addition to the first and second anode regions 10, 12. The separation region 16 is made, for example, of TEOS oxide and has a thickness that is, for example, greater than the thickness of the first and second anode regions 10, 12.

Extending underneath the substrate 6, and in direct contact with the latter, is a region 20, referred to hereinafter as "bottom contact region 20". The bottom contact region 20 is made of nickel silicide and has a thickness comprised, for example, between 100 nm and 400 nm.

The integrated electronic device 1 further comprises a multilayer bottom structure 22, arranged underneath the bottom contact region 20 and in contact with the latter. In a per se known manner, the multilayer bottom structure 22 may be formed by a succession of corresponding three layers, for example, a titanium (Ti) layer, a nickel (Ni) layer, and a gold (Au) layer. The multilayer bottom structure 22 functions as bottom metallization, and in particular as cathode metallization.

The integrated electronic device 1 further comprises a first top metallization 26 and a second top metallization 28, which extend, respectively, over the first and second anode regions 10, 12, with which they are, respectively, in direct contact. Albeit not illustrated, in a per se known manner, each of the first and second top metallizations 26, 28 may include a respective titanium layer (not illustrated), arranged in contact with the underlying anode region 10, 12, and an overlying region (not illustrated) formed by a conductive alloy (for example, AlSiCu).

The integrated electronic device 1 further comprises at least one further layer 30, referred to hereinafter as "filtering layer 30". The filtering layer 30 is made of a dielectric material, such as, for example, silicon dioxide ($SiO_2$) or else silicon nitride ($Si_3N_4$), and extends over the second anode region 12, with which it is in direct contact. The filtering layer 30 has a thickness comprised, for example, between 50 nm and 200 nm.

Without any loss of generality, the second top metallization 28 extends between the separation region 16 and the filtering layer 30, until it contacts, as previously explained, the second anode region 12. The second anode region 12 is delimited at the top by a third surface $S_{12a}$. Without any loss of generality, the third surface $S_{12a}$ has portions coated with the second top metallization 28 and portions coated with the filtering layer 30, but does not have exposed portions.

In practice, the first anode region 10 and the first epitaxial layer 8 form a first metal-semiconductor junction, of a rectifying type, i.e., characterized by the presence of a Schottky barrier. Likewise, the second anode region 12 and the first epitaxial layer 8 form a second metal-semiconductor junction, of a rectifying type. Furthermore, the substrate 6 and the bottom contact region 20 form a third metal-semiconductor junction, of a non-rectifying type; i.e., they form a so-called ohmic contact.

In greater detail, the first and second anode regions 10, 12 are substantially transparent for ultraviolet radiation. Further, the aforementioned first and second metal-semiconductor junctions form, respectively, a first sensor 32 and a second sensor 34, which are designed to detect ultraviolet radiation, i.e., to generate currents indicating the intensity of ultraviolet radiation, as described in greater detail hereinafter.

This having been said, in use, the multilayer bottom structure 22 is set at ground, whereas the first and second top metallizations 26, 28 are, respectively, set at a first negative voltage and a second negative voltage, which are, respectively, equal to −V1 and −V2, where V1 and V2 are non-negative and V2>V1. The first and second metal-semiconductor junctions are thus reverse biased. In these conditions, a first depleted region 36 and a second depleted region 38, separate from one another, are formed within the first epitaxial layer 8. The first depleted region 36 extends within a first portion of the epitaxial layer 8 starting from the first surface $S_{8a}$ and with a first depth, whereas the second depleted region 38 extends within a second portion of the epitaxial layer 8 starting from the first surface $S_{8a}$ and with a second depth greater than the first depth.

Figure 2:
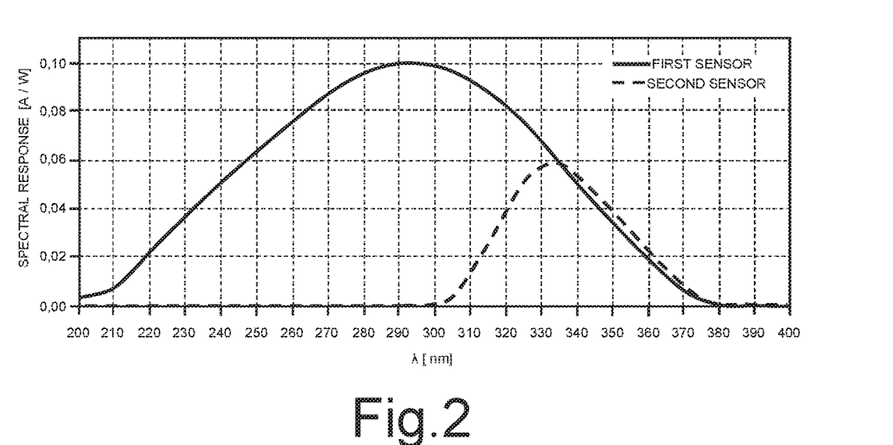
FIG. 2 shows examples of plots of electro-optical responses of two sensors formed in embodiments of the present integrated electronic device as the wavelength varies.

In greater detail, the first sensor 32 is a broadband sensor, which has a spectral response, i.e., a spectral efficiency (expressed in A/W), nonzero over the entire 200-to-380-nm range, as illustrated purely by way of example in FIG. 2. In particular, the spectral efficiency of the first sensor 32 has a peak in the 280-to-300-nm range; further, for the purposes of the present disclosure, the spectral efficiency of the first sensor 32 below 280 nm is insignificant since, as previously explained, UVC radiation is shielded by the atmosphere.

In practice, the first sensor 32 generates a current $I'_{tot}$, for which the following relation basically applies:

$$I'_{tot}=R'_{m\_A}\cdot P_{m\_UVA}+R'_{m\_B}\cdot P_{m\_UVB} \quad (1)$$

where $R'_{m\_A}$ and $R'_{m\_B}$ are known and indicate the averages of the spectral efficiency of the first sensor 32, respectively, in the 215-to-400-nm range and in the 280-to-315-nm range, whereas $P_{m\_UVA}$ and $P_{m\_UVB}$ indicate, respectively, the average powers (unknown) in the 215-to-400-nm range and in the 280-to-315-nm range of the radiation that impinges upon the integrated electronic device 1.

The second sensor 34 is a narrow-band sensor, which has a nonzero spectral efficiency in the 300-to-380-nm range, as illustrated, purely by way of example, in FIG. 2. In particular, the spectral efficiency of the second sensor 34 has a peak in the 330-to-340-nm range.

In greater detail, the spectral efficiency of the second sensor 34 in the 280-to-315-nm range is to a first approximation negligible, thanks to the presence of the filtering layer 30, which has a thickness such as not to transmit, to a first approximation, radiation having a wavelength comprised precisely in the 280-to-315-nm range. Furthermore, since V2>V1, it is found that the peak of the spectral efficiency of the second sensor 34 presents at a higher wavelength than the peak of the spectral efficiency of the first sensor 32. In fact, as mentioned previously, the second depleted region has a greater depth than the first depleted region. Consequently, the current generated by the second sensor 34 includes the contribution of the minority carriers generated following upon absorption of photons in the UVA interval, which are absorbed at greater depths as compared to the other photons in the ultraviolet. In this connection, as V2 increases, there occurs a shift of the peak of the spectral responsivity of the second sensor 34 towards higher wavelengths. In addition, purely by way of example, it may be shown that, in the case where the thickness of the epitaxial layer 8 is 30 μm, within the epitaxial layer 8 itself approximately 95% of the radiation having a wavelength equal to 330 nm is absorbed.

In practice, the second sensor 34 generates a current $I_A$, for which to a first approximation the following relation applies:

$$I_A=R''_{m\_A}\cdot P_{m\_UVA} \quad (2)$$

where $R''_{m\_A}$ is the average of the spectral efficiency of the second sensor 34.

This having been said, in practice the current $I'_{tot}$ indicates a global quantity, which depends upon the ultraviolet radiation (both UVA and UVB) that impinges upon the integrated electronic device. In this connection, the current $I'_{tot}$ indicates the UV index, as described hereinafter. In addition, the current $I_A$ indicates the UVA component of the aforementioned global quantity, i.e., it indicates $P_{m\_UVA}$. In addition, on the basis of the global quantity and of the UVA component, it is possible to determine also the UVB component of the global quantity, i.e., $P_{m\_UVB}$. In fact, the following relation applies:

$$P_{m\_UVB} = \frac{I'_{tot}}{I'_{m\_B}} - \frac{R'_{m\_A}}{R'_{m\_B}} \cdot \frac{I_A}{R''_{m\_A}} \qquad (3)$$

Figure 3:
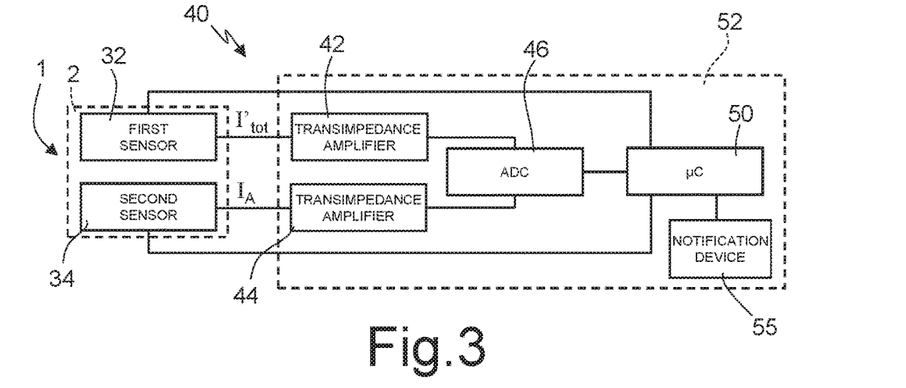
FIG. 3 shows a block diagram of a detection system comprising the present integrated electronic device.

As illustrated in FIG. 3, the integrated electronic device 1 may form a detection system 40, which further includes a first transimpedance amplifier 42 and a second transimpedance amplifier 44, an analog-to-digital converter 46, and a microcontroller unit 50. Purely by way of example, the first and second transimpedance amplifiers 42, 44, the analog-to-digital converter 46, and the microcontroller unit 50 may be formed in a second die 52, within an application-specific integrated circuit (ASIC).

The microcontroller unit 50 is electrically connected to the first and second top metallizations 26, 28, for applying the aforementioned first and second negative voltages (−V1, −V2), thus biasing the first and second sensors 32, 34. Purely by way of example, V1 may be 0 V and V2 may be 10 V.

The first and second transimpedance amplifiers 42, 44 are, respectively, connected to the first and second sensors 32, 34 in order to receive, respectively, the current $I'_{tot}$ and the current $I_A$. In this connection, even though in FIG. 3, for reasons of clarity, each of the first and second sensors 32, 34 has been represented with two terminals connected, respectively, to the microcontroller unit 50 and to the corresponding transimpedance amplifier, the latter are in actual fact connected to a same terminal, formed by the corresponding top metallization. For instance, with reference to the first sensor 32, the microcontroller unit 50 and the first transimpedance amplifier 42 are both connected to the first top metallization 26.

The outputs of the first and second transimpedance amplifiers 42, 44 are, respectively, connected to a first input and a second input of the analog-to-digital converter 46, which, in a per se known manner, supplies to the microcontroller unit 50 the digital values of the current $I'_{tot}$ and of the current $I_A$.

The microcontroller unit 50 determines the aforementioned quantities $P_{m\_UVA}$ and $P_{m\_UVB}$ on the basis of the digital values of the current $I'_{tot}$ and of the current $I_A$ and of Eqs. (1-3) appearing above. In this connection, it should be noted how the microcontroller unit 50 is able to determine the aforementioned quantities $P_{m\_UVA}$ and $P_{m\_UVB}$ also in the case where the spectral efficiency of the second sensor 34 in the range of UVB radiation is not negligible, as described hereinafter.

In general, if the spectral efficiency of the second sensor 34 in the range of UVB radiation is not negligible, the second sensor 34 generates, instead of the aforementioned current $I_A$, a current $I''_{tot}$ such that $$I''_{tot} = R''_{m\_A} \cdot P_{m\_UVA} + R|_{m\_B} \cdot P_{m\_UVB} \qquad (4)$$

where $R''_{m\_A}$ and $R''_{m\_B}$ are known and indicate the averages of the spectral efficiency of the second sensor 34, respectively, in the 215-to-400-nm and 280-to-315-nm ranges. In practice, Eqs. (1) and (4) define a system of two equations with two unknowns ($P_{m\_UVA}$ and $P_{m\_UVB}$), which is solved by the microcontroller unit 50, if the curves of spectral efficiency of the first and second sensors 32, 34 differ from one another, both in the UVA range and in the UVB range. In this connection, it is preferable, in each between the UVA range and the UVB range, for the spectral efficiency of the first and second sensors 32, 34 to differ from one another so that $R'_{m\_A}$ differs from $R''_{m\_A}$ for at least 10% of $R''_{m\_A}$, and $R'_{m\_B}$ differs from $R''_{m\_B}$ for at least 10% of $R''_{m\_B}$.

Irrespective of the details of implementation, the microcontroller unit 50 may then notify a user of the quantities $P_{m\_UVA}$ and $P_{m\_UVB}$, as well as a quantity indicating the current $I'_{tot}$, i.e., the total amount of ultraviolet radiation. For this purpose, the detection system 40 may comprise a notification device 55, which is operatively coupled to the microcontroller unit 50 and is formed, for example, by a display.

In greater detail, the current $I'_{tot}$ indicates the UV index, as mentioned previously. In fact, by means of a calibration procedure that avails itself of a sunlight simulator, it is for example possible to simulate a plurality of lighting conditions. For each lighting condition, it is possible to determine the corresponding UV index (in a per se known manner) and the corresponding current value $I'_{tot}$ supplied by the integrated electronic device 1. Next, this UV index and this current value $I'_{tot}$, referred to hereinafter as "UV calibration index" and "value of calibration current $I'_{tot}$", are stored, for example, in the microcontroller unit 50. In this way, in use, when the microcontroller unit 50 receives a given value of the current $I'_{tot}$, it may determine, and possibly display, also a corresponding value of UV index, on the basis of the value of the current $I'_{tot}$ received, as well as on the basis of the UV calibration indices and values of calibration current $I'_{tot}$.

Figure 4:
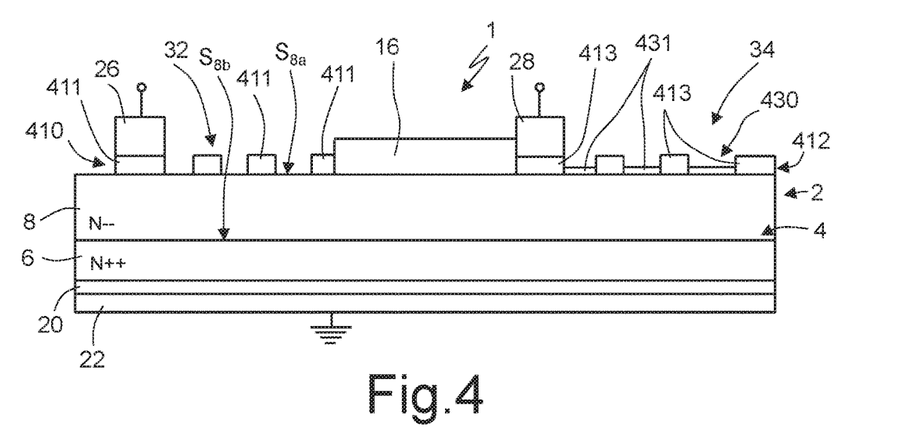

In general, the integrated electronic device 1 may present numerous variants with respect to what has been described. For instance, as illustrated in FIG. 4, it is possible for the first and second anode regions (here designated, respectively, by 410 and 412) to be patterned. In other words, it is possible for the first and second anode regions 410, 412 to be formed, respectively, by a plurality of first sub-regions 411 and by a plurality of second sub-regions 413.

In particular, the first sub-regions 411 are in electrical contact with one another and with the first top metallization 26. Further, the first sub-regions 411 are arranged for leaving portions of the first surface $S_{8a}$ exposed, each exposed portion being arranged between a corresponding pair of first sub-regions 411. In this way, access of photons to the underlying epitaxial layer 8 is facilitated, thus improving the performance of the first sensor 32. Likewise, the second sub-regions 413 are in electrical contact with one another and with the second top metallization 28. In addition, the filtering layer 30 is replaced by a filtering region 430, which is formed by a plurality of layers 431, referred to hereinafter as "coating elements 431". The second sub-regions 413 are arranged for defining portions of the first surface $S_{8a}$ not covered by any second sub-region 413. These non-covered portions are coated with corresponding coating elements 431, each of which is arranged between a corresponding pair of second sub-regions 413 and performs the same function as the filtering layer 30.

Figure 5:
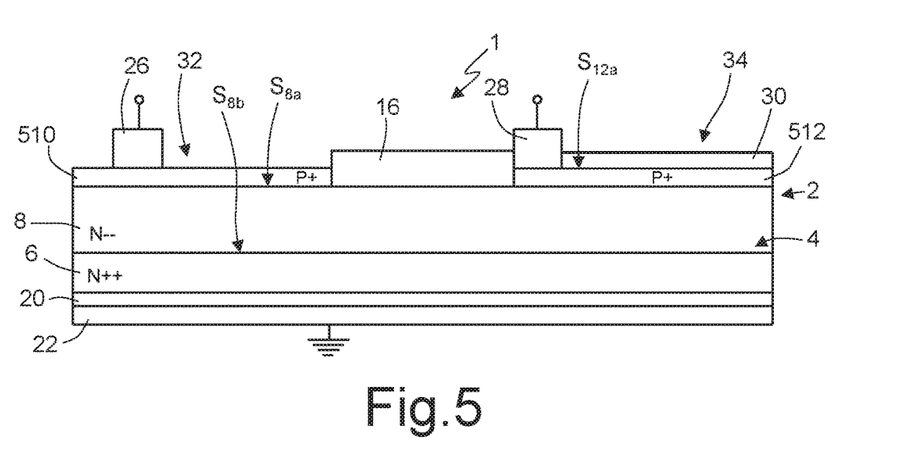

As illustrated in FIG. 5, it is further possible for the first and second anode regions (here designated by 510 and 512) to be made of semiconductor material, such as, for example, the 4H polytype of silicon carbide. In this case, the first and second anode regions 510, 512 are of a P+ type, have doping levels, for example, of $5 \cdot 10^{18}$ cm$^{-3}$ and thicknesses, for example, of less than 30 nm. For instance, the first and second anode regions 510, 512 may be formed by epitaxial growth on top of the epitaxial layer 8, or else by ion implantation in the epitaxial layer 8.

The present integrated electronic device 1 may be obtained with the manufacturing method described in what follows with reference, purely by way of example, to the embodiment illustrated in FIG. 1.

Figure 6:
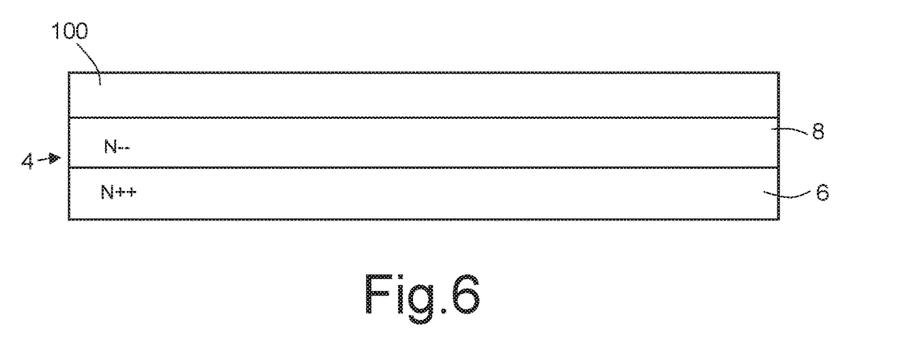
FIGS. 6-18 are schematic cross-sectional views (not in scale) of an embodiment of the present integrated electronic device during successive steps of a manufacturing process.

As illustrated in FIG. 6, initially the semiconductor body 4 is provided. In addition, a first sacrificial layer 100, of dielectric material (for example, TEOS), is formed on the epitaxial layer 8. The first sacrificial layer 100 has a thickness, for example, of 0.8 μm and performs a protective function.

Figure 7:
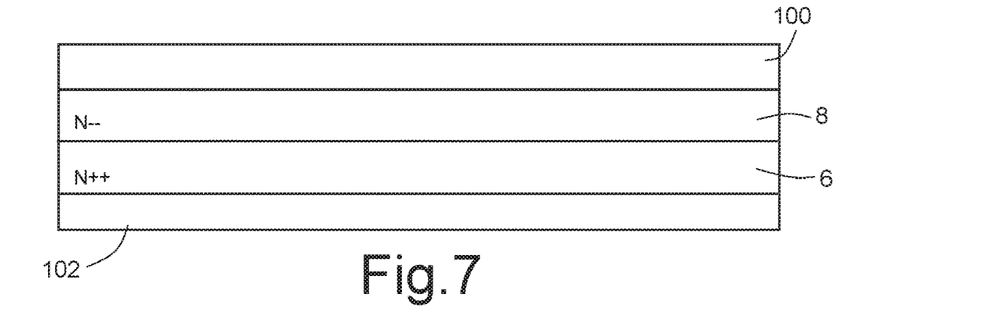

Then, as illustrated in FIG. 7, underneath the substrate 6, and thus on the back of the integrated electronic device 1, a layer 102 is formed, referred to hereinafter as "first conductive layer 102". The first conductive layer 102 is made of nickel. Further, the first conductive layer 102 is formed, for example, by sputtering and has a thickness, for example, of approximately 200 nm.

Figure 8:
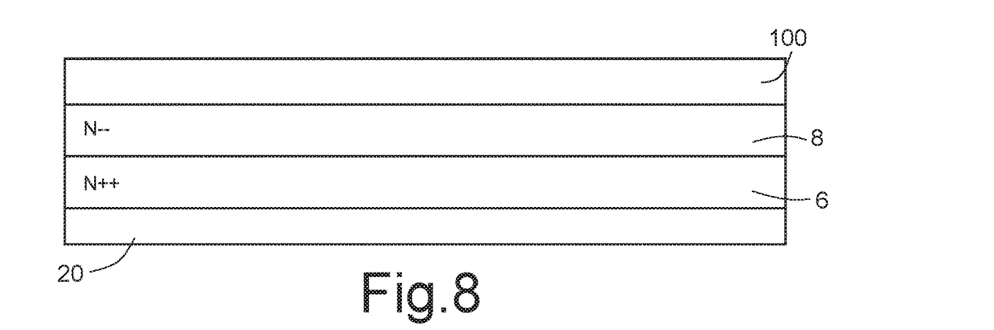

Next, as illustrated in FIG. 8, a first annealing is carried out in an environment containing nitrogen gas ($N_2$), following upon which the first conductive layer 102 forms the bottom contact region 20. For instance, the first annealing is carried out at a temperature of 1000° C. and lasts approximately 60 s.

Figure 9:
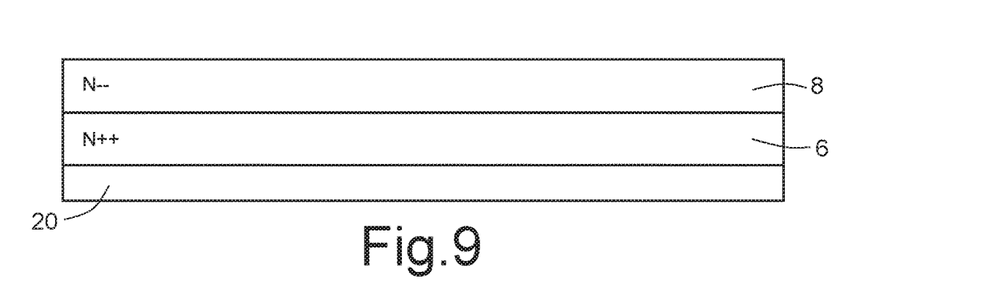

Next, as shown in FIG. 9, the first sacrificial layer 100 is removed, for example by means of a wet etch.

Figure 10:
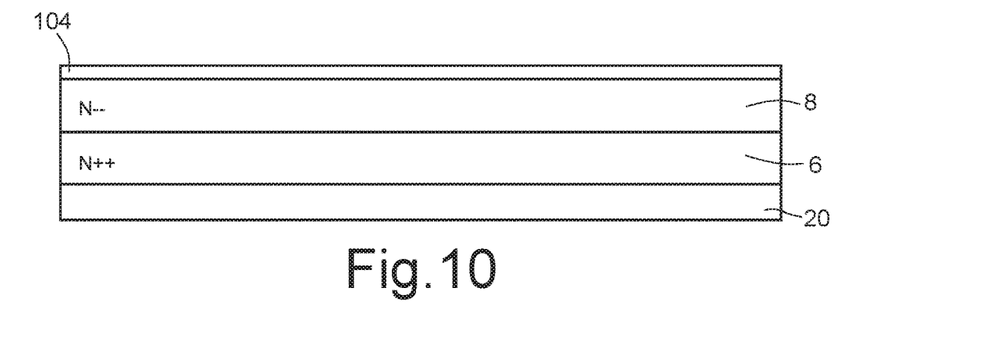

Then, as illustrated in FIG. 10, formed on the front of the integrated electronic device 1 is a second conductive layer 104. In particular, the second conductive layer 104 is made of nickel and extends on the epitaxial layer 8; further, the second conductive layer 104 has a thickness, for example, of 10 nm and is formed, for example, by sputtering.

Figure 11:
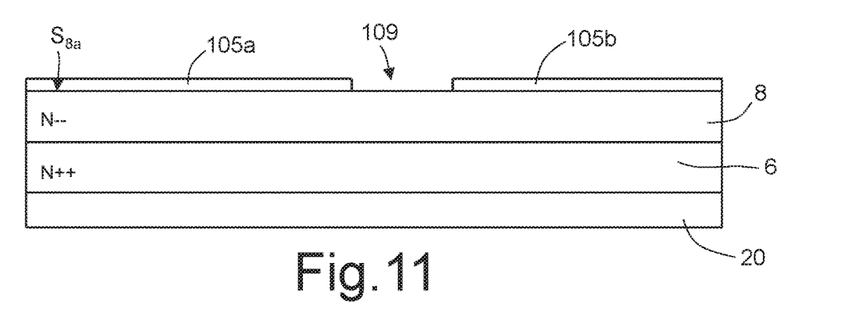

Next, as illustrated in FIG. 11, is carried out selective removal of a portion of the second conductive layer 104 is carried out using a corresponding photomask (not illustrated) and a subsequent wet etch. In this way, a window 109 is formed within the second conductive layer 104; then, a portion of the first surface $S_{8a}$ is exposed. In addition, the window 109 separates a first portion 105a and a second portion 105b of the second conductive layer 104, which are laterally staggered.

Figure 12:
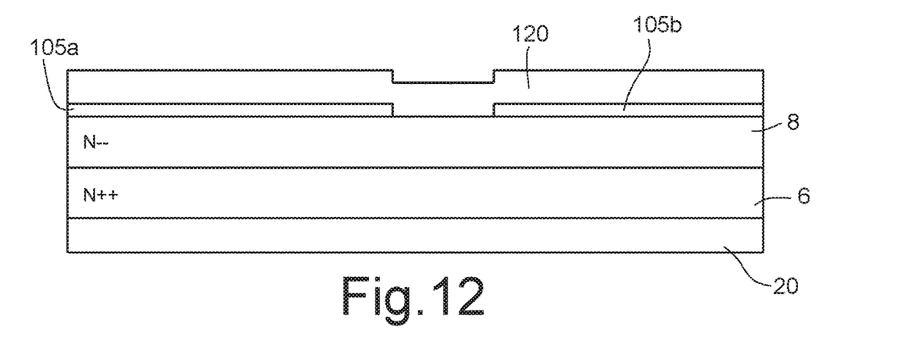

Then, as illustrated in FIG. 12, an insulating layer 120 of a dielectric material (for example, TEOS) is laid. In particular, the insulating layer 120 is formed on the front portion of the integrated electronic device 1 so that it extends over the first and second portions 105a, 105b of the second conductive layer 104, as well as within the window 109, i.e., on top of the previously exposed portion of the first surface $S_{8a}$.

Figure 13:
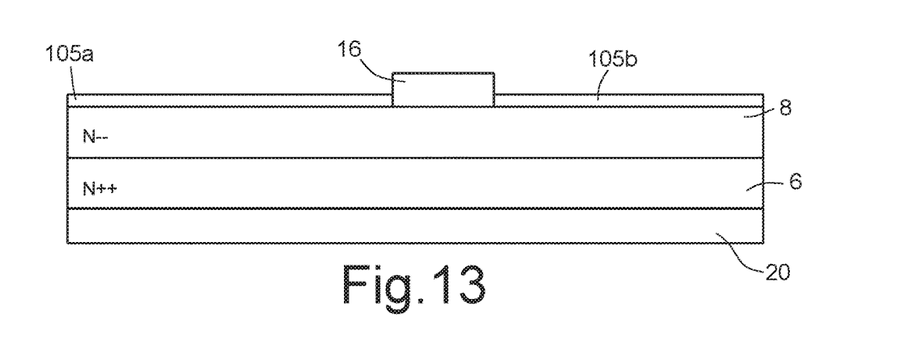

Next, as illustrated in FIG. 13, selective removal of portions of the insulating layer 120 is carried out using a corresponding photomask (not illustrated) and a subsequent dry etch. In this way, the separation region 16 is formed.

Figure 14:
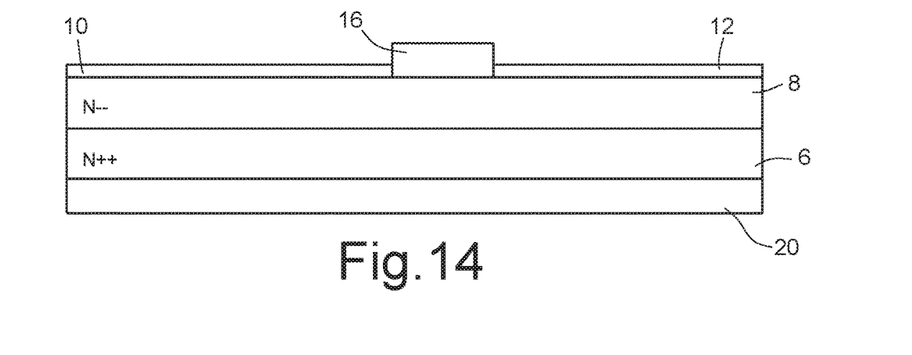

Then, as illustrated in FIG. 14, a second annealing is carried out in an environment containing nitrogen gas ($N_2$), following upon which the first and second portions 105a, 105b of the second conductive layer 104 form, respectively, the first and second anode regions 10, 12, which, as has been said, are made of nickel silicide ($Ni_2Si$). For instance, the second annealing is carried out at a temperature of 700° C. and lasts approximately 20 s.

Figure 15:
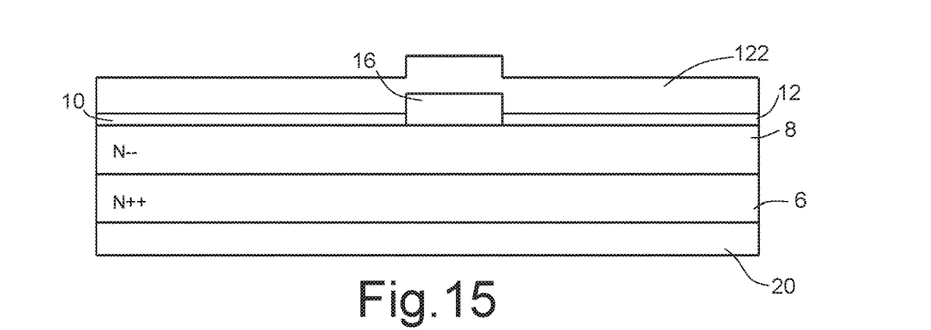

Next, as illustrated in FIG. 15, a front metal region 122 is formed on top of the separation region 16 and of the first and second anode regions 10, 12. Even though not illustrated in detail, the front metal region 122 may include a respective titanium layer (not illustrated), arranged in contact with the separation region 16 and the first and second anode regions 10, 12, and an overlying region (not illustrated) formed by a conductive alloy (for example, AlSiCu). Furthermore, the front metal region 122 is formed by sputtering and has a thickness, for example, of 3 μm.

Figure 16:
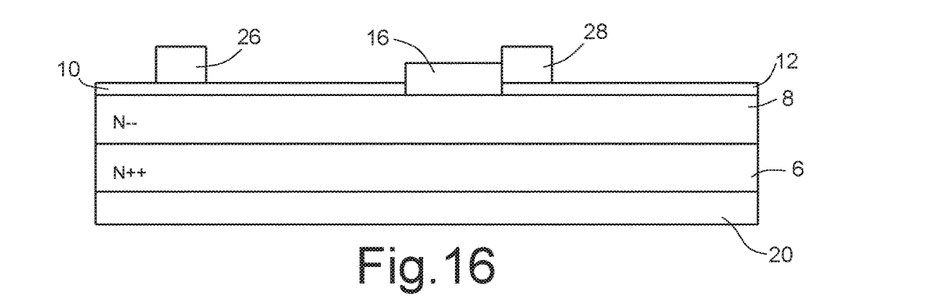

Then, as illustrated in FIG. 16, selective removal of portions of the front metal region 122 is carried out using a corresponding photomask (not illustrated) and a subsequent wet etch. In this way, the first and second top metallizations 26, 28 are formed.

Figure 17:
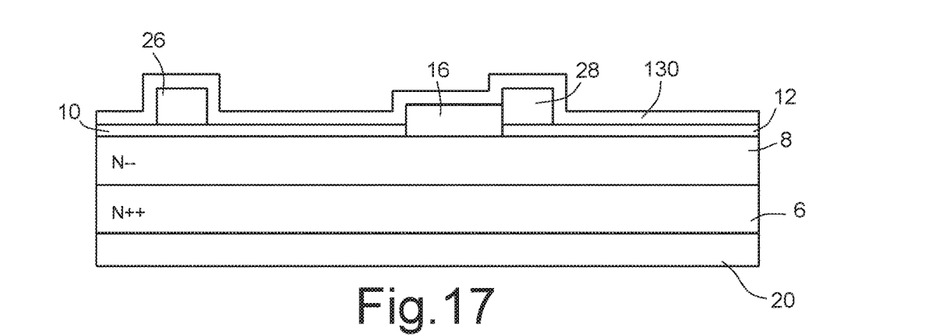

Next, as illustrated in FIG. 17, laid on the front portion of the integrated electronic device 1 is a dielectric layer 130 that is to form the filtering layer 30. In particular, the dielectric layer 130 is formed on top of the first and second top metallizations 26, 28, as well as on top of the first and second anode regions 10, 12 and of the separation region 16.

In greater detail, the dielectric layer 130 may be formed, for example, by means of plasma-enhanced chemical vapor deposition (PECVD).

For instance, the dielectric layer 130 may be formed by implementing the following chemical reaction, which involves tetraethyl orthosilicate (TEOS) and oxygen:

$$Si(OC_2H_5)_4 + O_2 \rightarrow SiO_2 + \text{by-products}$$

in which case the dielectric layer 130 is formed, that is, by silicon dioxide ($SiO_2$). In this case, the dielectric layer 130 and thus also the filtering layer 30 have a thickness comprised, for example, between 50 nm and 200 nm. In addition, the aforementioned chemical reaction may be obtained with the following gas flows: 700 sccm of TEOS and 400 sccm of oxygen.

Alternatively, it is possible to implement the following chemical reaction:

$$SiH_4 + NH_3 + N_2 \rightarrow SiN(H) + \text{by-products}$$

in which case the dielectric layer 130 is made of non-stoichiometric silicon nitride ($Si_3N_4$), containing 10%-30% hydrogen, thus the notation SiN(H). In this connection, by reducing the flow of ammonia ($NH_3$), the presence of hydrogen within the non-stoichiometric silicon nitride is reduced, but also the deposition rate is reduced. In addition, high concentrations of Si—H bonds cause the dielectric layer 130 to have a low transmittance at the lower wavelengths of the ultraviolet band.

In general, in what follows the film of silicon nitride with high hydrogen content and high deposition rate will be referred to as "SiN HDR film". In addition, the film of silicon nitride with low hydrogen content and low deposition rate will be referred to as "SiN LDR film".

This having been said, in the case where the dielectric layer 130 is formed by a SiN HDR film, this, and thus also the filtering layer 30, may have a thickness comprised, for example, between 100 nm and 200 nm. In addition, the above chemical reaction may be obtained with the following gas flows: 140 sccm of $SiH_4$, 75 sccm of $NH_3$, and 2500 sccm of $N_2$. Instead, in the case where the dielectric layer 130 is formed by a SiN LDR film, it, and thus also the filtering layer 30, may have a thickness comprised, for example, between 50 nm and 200 nm. In addition, the preceding chemical reaction may be obtained with the following gas flows: 50 sccm of $SiH_4$, 55 sccm of $NH_3$, and 2500 sccm of $N_2$.

Once again by way of example, it is further possible for the dielectric layer 130 to be formed by implementing the following chemical reaction:

$$SiH_4 + NH_3 + N_2O + N_2 \rightarrow SiON + \text{by-products}$$

in which case the dielectric layer 130 has a composition that may vary between silicon dioxide $SiO_2$ and a non-stoichiometric silicon nitride, according to the gas flows used. In this case, the hydrogen content within the dielectric layer 130 is reduced.

Figure 18:
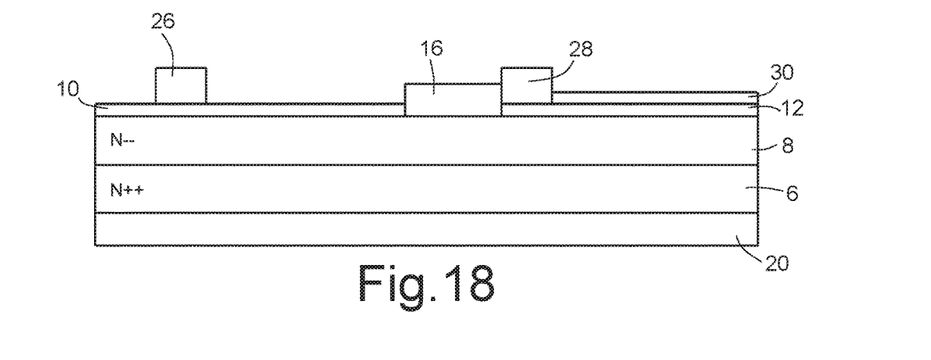

Irrespective of the details regarding the dielectric layer 130, portions thereof are then selectively removed, for example using a corresponding mask (not illustrated) and a dry etch, as illustrated in FIG. 18. Following upon this selective removal, the remaining portion of the dielectric layer 130 forms the filtering layer 30.

Then, in a per se known manner and not illustrated, on the back of the integrated electronic device 1 the multilayer bottom structure 22 is formed, for example by sputtering.

From what has been described and illustrated previously, the advantages that the present solution affords emerge clearly.

In particular, the present integrated electronic device forms a monolithic and thus compact device, which enables monitoring both of the overall irradiance in the ultraviolet and of the UVA and UVB components and thus enables detection of the composition of the ultraviolet radiation. Furthermore, the first and second sensors 32, 34 may operate also in the presence of reduced reverse biasing, with consequent reduction of consumption.

The present integrated electronic device is thus suited to numerous uses since it enables the user to be provided with additional information in addition to the UV index. For instance, the present integrated electronic device may be used for distinguishing natural light from artificial light since these present ultraviolet radiation of different spectral composition.

In conclusion, it is clear that modifications and variations may be made to what has been described and illustrated herein, without thereby departing from the scope of the present disclosure.

For instance, the semiconductor body may be formed, instead of by silicon carbide, by a different semiconductor material, such as, for example, a semiconductor chosen between gallium nitride (GaN), silicon (Si), or gallium and aluminum nitride (AlGaN).

Instead of the filtering layer 30, there may be present a multilayered optical structure, which forms, for example, a so-called "Bragg grating". Once again by way of example, instead of the filtering layer 30, there may be present an optical structure formed by a plurality of filtering layers. For instance, the optical structure may be formed by a SiN LDR film and by a SiN HDR film, or else by a SiN film and by a film of TEOS. Furthermore, as the number of layers that form the multilayered optical structure increases, it is possible to filter the UVB radiation with greater precision.

As regards the second sensor 34, it may be sensitive, for example, just to UVB radiation, instead of just to UVA radiation, even though the Applicant has noted how filtering of UVB radiation may be obtained in a simpler way as compared to filtering of UVA radiation.

As regards the first and second anode regions, they may be made of a metal material, such as for example platinum, nickel or gold, instead of a silicide, even though the latter enables formation of a more stable barrier.

As regards the first and second conductive layers, they may be made of a material different from nickel, such as for example titanium. In this case, the first and second anode regions are made of titanium silicide. Furthermore, in the case where the first and second anode regions are made of semiconductor material of a P type, the second conductive layer 104 is also made of semiconductor material of a P type. In this case, the second conductive layer 104 may be formed by epitaxial growth or ion implantation.

As regards the bottom contact region 20, it may be absent, in which case the multilayer bottom structure 22 contacts the substrate 6 directly.

As regards the manufacturing method, it is possible for the steps of this method to be carried out in an order different from what has been described. For instance, the first annealing, and thus silicidation of the first and second portions 105a, 105b of the second conductive layer 104, may be performed after formation of the window 109, but before deposition of the insulating layer 120.

Finally, the types of doping may be reversed with respect to what has been described.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
an integrated electronic device configured to detect the composition of ultraviolet radiation, the integrated electronic device including:
    a cathode region formed by a semiconductor material, the cathode region having a surface;
    a separation region formed on the surface of the cathode region;
    a first patterned anode region and a second patterned anode region spaced apart on the surface of the cathode region, the separation region positioned between the first and second patterned anode regions and each of the first and second patterned anode regions including a plurality of sub-regions formed spaced apart on the surface of the cathode region, the plurality of sub-regions of the first patterned anode region being electrically coupled to one another and the plurality of sub-regions of the second patterned anode region being electrically coupled to one another;
    a first sensor including the cathode region and the first anode region, the first sensor configured to generate a first electrical signal responsive to incident ultraviolet radiation having a spectral range corresponding to the UVA band and the UVB band, the first sensor having a first non-zero spectral efficiency for incident ultraviolet radiation in the spectral range;
    a second sensor including the cathode region and the second anode region, the second sensor configured to generate a second electrical signal responsive to incident ultraviolet radiation in the spectral range, the second sensor having a second non-zero spectral efficiency different than the first spectral efficiency;
a notification device configured to provide a notification; and
a processor coupled to the integrated electronic device and to the notification device, the processor configured to determine an estimate of the power of the ultraviolet radiation in the UVA band and an estimate of the power of ultraviolet radiation in the UVB band as a function of the first and second electric signals, and to control the notification device to provide notifications of the estimated powers of ultraviolet radiation in the UVA and UVB bands.

2. The system of claim 1, wherein the processor is further configured to provide an ultraviolet index notification indicating a total amount of incident ultraviolet radiation.

3. The system of claim 2, wherein the notification device comprises a display.

4. The system of claim 1, wherein the processor comprises a microcontroller.

5. The system of claim 1, wherein the processor is configured to determine the estimate of the power of ultraviolet radiation in the UVA band on the basis of the second electrical signal, and wherein said processing stage is further configured to determine the estimate of the power of ultraviolet radiation in the UVB band on the basis of the first electrical signal and of the estimate of the power of ultraviolet radiation in the UVA band.

6. The system of claim 1 further comprising:
a first transimpedance amplifier coupled to receive the first electrical signal;
a second transimpedance amplifier coupled to receive the second electrical signal;
an analog-to-digital converter coupled to the first and second transimpedance amplifiers and to the processor, the analog-to-digital converter configured to digitize the first and second electrical signals and provide these digitized first and second electrical signals to the processor.

7. The system of claim 6, wherein the first and second sensors are formed in a first die and the first and second transimpedance amplifiers, analog-to-digital converter, and the processor are formed in a second die.

8. The system of claim 1, wherein each of the first and patterned anode regions are formed from a material that is substantially transparent to ultraviolet radiation.

9. The system of claim 1, wherein each of the first and patterned anode regions are formed from nickel silicide.

10. The system of claim 1, wherein each of the first and second patterned anode regions are formed from a semiconductor material.

11. The system of claim 1, wherein the cathode region comprises an epitaxial layer.

12. An integrated electronic device, comprising:
a cathode region having a surface;
a first anode region and a second anode region laterally staggered with respect to one another and formed on the surface of the cathode region;
a separation region of insulating material formed on the surface of the cathode region;
a first sensor including the cathode region and the first anode region that in operation generates a first electrical signal responsive to incident ultraviolet radiation, the ultraviolet radiation having a spectral range corresponding to the UVA band and the UVB band and the first sensor having a first non-zero spectral efficiency for incident ultraviolet radiation in the spectral range;
a second sensor including the cathode region and the second anode region that in operation generates a second electrical signal responsive to incident ultraviolet radiation in the spectral range, the second electrical signal independent of the first electrical signal and the second sensor having a second non-zero spectral efficiency different than the first spectral efficiency.

13. The integrated electronic device of claim 12, wherein the first sensor has a nonzero spectral efficiency in the spectral range and the second sensor has a substantially zero spectral efficiency in one of the UVA band and the UVB band.

14. The integrated electronic device of claim 12, wherein the each of the first and second anode regions comprises one of nickel silicide and a semiconductor material.

15. A method, comprising:
forming a cathode region of semiconductor material having a surface;
forming a first patterned anode region on the surface of cathode region, the first patterned anode region including a plurality of sub-regions having portions of the surface of the cathode region exposed between adjacent ones of the sub-regions;
forming a second patterned anode region on the surface of the cathode region, the second patterned anode region including a plurality of sub-regions having portions of the surface of the cathode region exposed between adjacent ones of the sub-regions;
forming a filtering region in association with one of the first and second patterned anode regions to form a first sensor including the cathode region and the first patterned anode region and having a spectral range of the UVA and UVB bands and a first spectral efficiency over these bands, and a second sensor including the cathode region and the second patterned anode region having a spectral range of the UVA and UVB bands and a second spectral efficiency over these bands that is different from the first spectral efficiency.

16. The method of claim 15, wherein forming a cathode region of semiconductor material having the surface comprises epitaxially growing the cathode region on a substrate.

17. The method of claim 15, wherein forming the first and second patterned anode regions comprise forming a material that is substantially transparent to ultraviolet radiation on the surface of the cathode region and patterning the material to form the first and second patterned anode regions.

18. The method of claim 15, wherein forming the first and second patterned anode regions comprise forming a layer formed from one of nickel silicide and a semiconductor material on the surface of the cathode region and patterning the layer to form the first and second patterned anode regions.

19. The method of claim 15 further comprising forming on the surface of the cathode region between the first patterned anode region and the second patterned anode region a separation region of dielectric material.

20. The method of claim 15 further comprising forming a first metallization and a second metallization in contact with the first and second patterned anode regions, respectively.

* * * * *